United States Patent [19]
Toedtman

[11] Patent Number: 5,721,404
[45] Date of Patent: Feb. 24, 1998

[54] THIN WALL FRAME CONSTRUCTION FOR ELECTRONIC DEVICES

[75] Inventor: Thomas Toedtman, Lake Forest, Calif.

[73] Assignee: AST Research Inc., Irvine, Calif.

[21] Appl. No.: 708,235

[22] Filed: Sep. 6, 1996

[51] Int. Cl.$^6$ ........................................ H01H 9/26
[52] U.S. Cl. ........................................ 200/5 A; 200/16 D
[58] Field of Search ........................................ 200/5 R, 5 A, 200/5 E, 16 D; 174/250, 256, 260, 263, 266; 361/720, 723, 736, 742, 748, 752, 753, 758

[56] References Cited

U.S. PATENT DOCUMENTS

| | | | |
|---|---|---|---|
| 4,792,880 | 12/1988 | Cather et al. | 361/823 |
| 5,438,480 | 8/1995 | Yamashita | 361/760 |
| 5,456,402 | 10/1995 | Curtin | 228/43 |
| 5,612,520 | 3/1997 | Toedtman | 200/16 D |

Primary Examiner—Matthew V. Nguyen
Attorney, Agent, or Firm—Knobbe, Martens, Olson, & Bear LLP

[57] ABSTRACT

A frame component for a notebook computer wherein the frame component has tapered (e.g., conical) depressions that receive protrusions from printed circuit boards mounted adjacent the frame component. The tapered depressions are formed during plastic injection molding of the frame component by a tapered (e.g., conical) protrusion in the interior cavity of the mold. The tapered protrusion in the mold facilitates flow of molten plastic through a region between the apex of the protrusion and an inner surface of the mold which allows for smaller tolerances between the apex of the tapered depression and the bottom surface of the frame component. This results in an overall reduction in the thickness of the frame component from on the order of 3–4 mm to on the order of 1.5 mm. The tolerance between the bottom of the depression configured to receive the protrusion from the printed circuit board is on the order of 0.3–0.4 mm.

16 Claims, 2 Drawing Sheets

THIN WALL FRAME CONSTRUCTION FOR ELECTRONIC DEVICES

BACKGROUND OF THE INVENTION

1. Field of the Invention

The present invention generally relates to electronic devices, and, more particularly, concerns the frame components of such devices and a method of manufacturing the same.

2. Description of the Related Art

Over the past decade, portable personal computers have evolved from large suitcase-size portable computers to smaller laptop computers and then to even smaller notebook computers. Small size greatly facilitates the portability of the computers, and, currently, notebook personal computers can be carried by travelers in briefcases and the like. While the current trend in portable personal computers is towards smaller, thinner and lighter personal computers, the functionality and complexity of the computers has increased. Hence, it has become more difficult to reduce the size and weight of the computers without sacrificing the functional ability.

The frame components comprise a significant portion of the thickness and weight of a personal computer. These frame components are generally made of plastic pieces and are typically manufactured using injection molding techniques. Generally, these frame components can include such things as the outer casing of the computer and interior struts within the computer.

In portable computers, such as notebook computers, printed circuit boards containing electronic devices are positioned substantially adjacent the frame components so that the dimensions of the portable computer are minimized. However, the printed circuit boards often have components and component lead protrusions which project in the direction of the frame components. To accommodate these protrusions, the frame components often are spaced away from the printed circuit boards by an amount equal to the height of the protrusion (a distance hereinafter referred to as the protrusion gap).

Alternatively, a depression in the frame wall could be added to accommodate the protrusions; however, the region of the frame components underneath the depressions that accommodates the protrusion must be relatively thick because otherwise the plastic will not adequately flow through this region during the plastic injection process to provide a uniform frame component. Further, if the region is not sufficiently thick, blemishes can appear on the surface of the frame component opposite the depression. In notebook computers, these depressions are sometimes formed in frame components that form the outer cover of the computer, and, in this application, the blemishes are very noticeable defects in the computer.

Consequently, in the prior art, protrusions from printed circuit boards are generally accommodated by spacing the printed circuit boards from the frame components. Most frame components of notebook computers in the prior art are on the order of 1.5 to 2 mm thick and a protrusion gap of 1.8 to 3.8 mm is typically provided between the bottom of the printed circuit board and the outer surface of the frame component to accommodate protrusions. Hence, the inability to provide depressions in the frame components for frame components that are as thin as 1.5 mm results in significantly thicker devices as the protrusions are almost invariably accommodated through spacing the printed circuit board away from the frame component.

Thus, a significant portion of the overall thickness of the product is the result of ensuring that there is adequate clearance between the bottom of the printed circuit board and the frame component to accommodate the protrusions. Consequently, to reduce the overall thickness of an electronic device like a computer, there is a need for a configuration of frame component which reduces the protrusion gap, i.e., allows the printed circuit board to be positioned closer to the frame component. To this end, there is a need for making a depression in a frame component in a manner that still allows for adequate flow of plastic during an injection molding process of the frame component to thereby avoid blemishes and the like in the outside surface of the frame component.

SUMMARY OF THE INVENTION

The aforementioned needs are satisfied by the frame component of the present invention which comprises a frame component of a first desired thickness having one or more tapered (e.g., conical) depressions formed therein to accommodate protrusions from a printed circuit board mounted adjacent the frame component. In one aspect of the present invention, the frame component is formed by injecting molten plastic into a mold having one or more tapered protrusions that correspond to the tapered depressions in the frame component. The shape of the tapered protrusion allows for enhanced flow of the molten plastic underneath the protrusion, which reduces the needed wall thickness between the bottom of the tapered depression and the outer surface of the frame component without causing conditions which create blemishes, and which allows the printed circuit boards to be positioned closer to the frame components thereby reducing the overall thickness of the product.

In one aspect of the present invention, the frame component comprises an external frame component such as an outer wall of a notebook computer. In this aspect, the tapered depression permits sufficient flow of plastic during the injection molding of the frame component so that there are few or no blemishes in the outer wall of the notebook computer. In another aspect of the present invention, the frame component comprises an internal frame component wherein the tapered depression permits the printed circuit board to be positioned closer to the frame component thereby reducing the overall dimensions of the device.

In the preferred embodiment, the space between the bottom of the tapered depression and the outer surface of the frame component is on the order of 0.3 to 0.4 mm. For a 2 mm thick frame component, this allows the protrusion gap to be reduced by over 1.5 mm because the printed circuit board can be positioned that much closer with the protrusions being positioned within the depressions. Hence, the protrusion gap of the present invention is significantly smaller due to the reduced clearance between the bottom of the depression and the outer surface of the frame component that is a consequence of the manufacturing process of the present invention.

The present invention allows products to be fabricated which are thinner than comparable products in the prior art. In particular, the frame components can then be used in portable computers which results in reduced dimensions of the portable computer without affecting the visible characteristics of the frame component or the stiffness of the frame component.

These and other advantages of the present invention will become more fully apparent from the following description taken in conjunction with the accompanying drawings.

DETAILED DESCRIPTION OF THE PREFERRED EMBODIMENT

Figure 1:
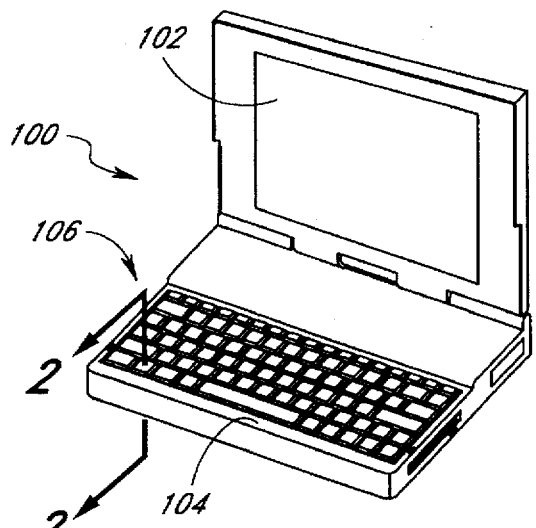
FIG. 1 is a perspective view of a notebook computer which can incorporate frame components of the present invention or of the prior art.

Reference will now be made to the drawings wherein like numerals refer to like parts throughout. FIG. 1 illustrates a notebook computer 100 that can be constructed using either frame components of the preferred embodiment or frame components of the prior art. Typically, the portable computer 100 includes a display screen 102 and a keyboard 104. The keyboard 104 includes a plurality of keys 106.

Figure 2:
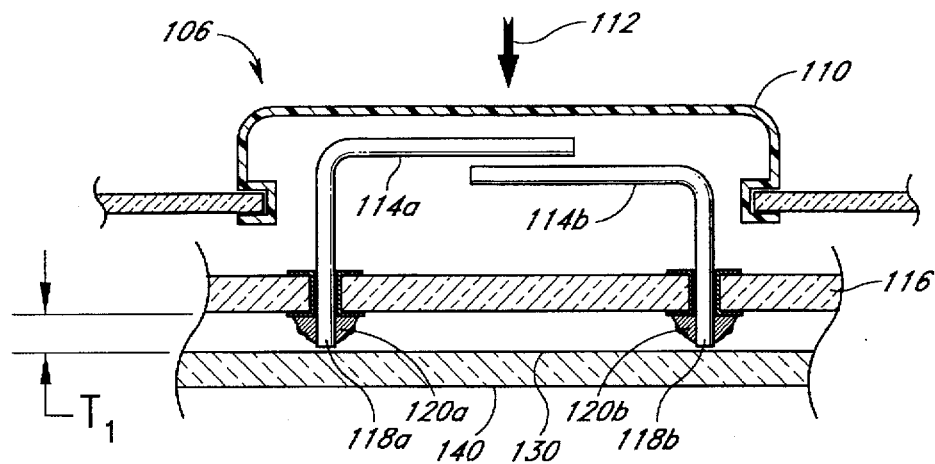
FIG. 2 is a detailed cross-sectional view of a key switch of the computer of FIG. 1 illustrating a frame component of the prior art.

FIG. 2 is a simplified cross-sectional diagram of one of the keys 106 which illustrates a typical frame component 130 of the prior art in greater detail. Specifically, the key 106 includes a depressible member 110 which, when depressed in the direction of arrow 112, results in two contacts 114a and 114b touching. The circuit leads from the contacts 114a and 114b are mounted to a printed circuit board 116 and have protrusions 118a and 118b extending therethrough. The protrusions are typically attached to the printed circuit board 116 via solder points 120a and 120b, respectively.

As illustrated in FIG. 2, the printed circuit board 116 is typically mounted on posts (not shown) that are attached to the frame component 130 so that the printed circuit board 116 is spaced away from the frame component 130 a distance $T_1$, so as to accommodate the protrusions 118a and 118b. However, this results in an increase in the overall thickness of the device 100.

Figure 3:
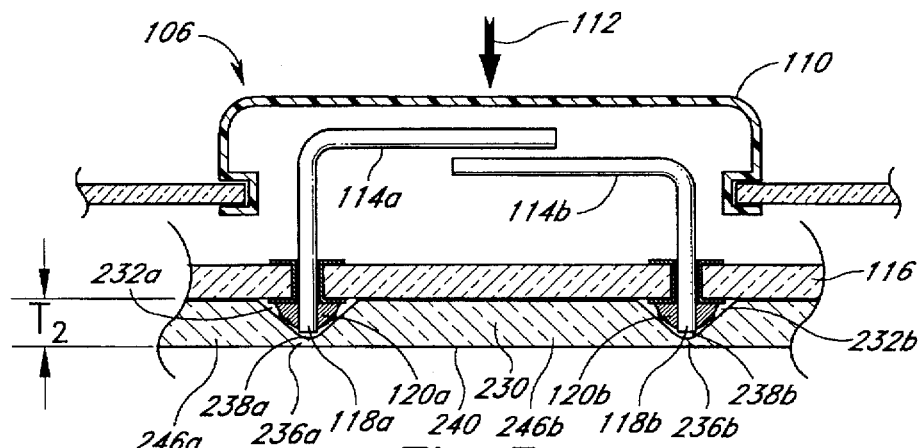
FIG. 3 is a detailed cross-sectional view of a key switch of the computer of FIG. 1 illustrating the frame component of the preferred embodiment.

FIG. 3 illustrates a frame component 230 of the preferred embodiment that can be used in conjunction with the switch 106 of the computer 100. Specifically, the frame component 230 has tapered (e.g., conical-shaped) depressions 232a, 232b that are configured to receive the protrusions 118a, 118b and the solder points 120a, 120b of the key assembly 106. As is also shown in FIG. 3, the tapered depressions 232a, 232b allow the printed circuit board 116 to be positioned immediately adjacent the frame component 230 thereby reducing the overall thickness of the device 100 by substantially eliminating the protrusion gap $T_1$. It will be further appreciated that the tapered depressions 232a, 232b have advantages over cylindrical shaped depressions as they permit easier flow of plastic during injection molding in a region 236a, 236b between the bottom surface 238a, 238b of the tapered depressions 232a, 232b and a bottom surface 240 of the frame component 230 as will be described in greater detail hereinbelow. As will be discussed in greater detail in reference to FIG. 4 hereinbelow, the tapered shape of the depressions 232a, 232b is the result of a mold used in a plastic injection molding process having tapered (e.g., conical-shaped) protruding members that define the interior surfaces of the conical depressions 232a, 232b.

In one preferred embodiment, the frame component has a thickness $T_2$ of approximately 1.5 mm, and the thickness of the region 236a, 236b of the frame component 230 is on the order of 0.2 to 0.3 mm. Further, the tapered depressions 232a, 232b have depths on the order of 1.2 mm and diameters at an upper surface 242 of the frame component 230 that are on the order of 3 mm. Hence, the frame component 230 of the preferred embodiment is similar in overall thickness as frame components of the prior art and is capable of accommodating protrusions without requiring the printed circuit boards to be spaced as far from the frame component. Further, the tapered shapes of the depressions also allow for relatively deep depressions into the frame component, e.g., more than 80 percent of the frame component, without resulting in blemishes on the bottom surface 240 of the frame component.

The frame component 230 can also be viewed as a component 230 that comprises at least two regions 246a, 246b that are separated by one of the depressions 232a or 232b interposed therebetween. The two regions 246a, 246b have substantially the same thickness, $T_1$, and the bottom surfaces 240 of these regions are coplanar.

Figure 4:
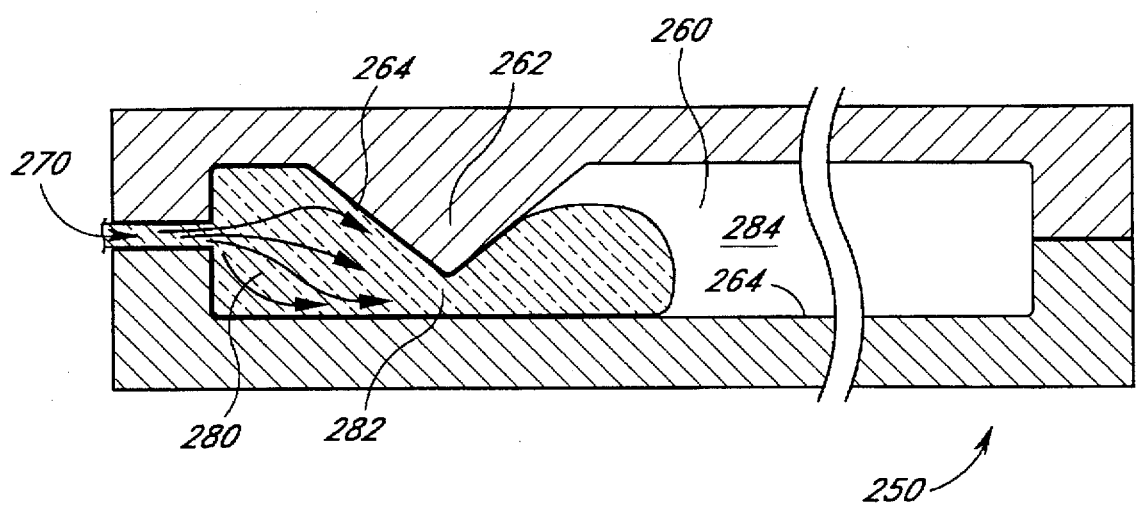
FIG. 4 is a cross-sectional diagram of an exemplary plastic injection molding die that is used to fabricate the frame component of FIG. 3.

FIG. 4 is a cross-sectional diagram of a small portion of an exemplary mold 250 that can be used to manufacture thin wall frame components such as the frame component 230 of the preferred embodiment. Specifically, the mold 250 defines a cavity 260 that corresponds to the desired configuration of the frame component 230. It will be appreciated that the mold 250 is manufactured for a specific configuration of a frame component and that a mold 250 will have to be created for each frame component that is manufactured according to the process of the preferred embodiment.

As shown in FIG. 4, the mold 250 defines a tapered (e.g., conical) protrusion or projection 262 which extends into the cavity 260. The tapered protrusion 262 corresponds to one of the tapered depressions 232a, 232b of the frame component 230 shown in FIG. 3. The tapered protrusion 262 in the mold 250 defines an inclined surface 264 which forms a inclined flow path for molten plastic that is injected through an injection port 270 in the direction of the arrows 280. The inclined surface 264 thereby facilitates the flow of plastic into a region 282 that would correspond to one of the regions 236a, 236b of the component 230. In effect, the inclined surface 264 channels the molten plastic that is injected through the port 270 through the area 282 and into the area 284 beyond. The existence of the inclined surface 264 thereby facilitates flow of the molten plastic during the injection molding process through a narrower region of the mold which results in more uniform distribution of the molten plastic within the cavity 260 of the mold 250. Hence, the distance between the bottom of the tapered protrusion 262 and a bottom surface 264 of the cavity 260 can be reduced, thereby resulting in localized thinner wall thicknesses without significantly decreasing the uniformity of distribution of plastic within the cavity 260. It will be appreciated that the mold 250 is sufficiently large to mold an entire frame at one time. Although only a single protrusion 262 is shown in FIG. 4, the mold 250 will include numerous projections or protrusions to form depressions at selected locations on the surface of the frame component.

As a result of using the present invention, the overall thickness of a frame and printed circuit board with protrusions constructed in accordance with the preferred embodiment is thinner. This reduces the overall dimensions of an electronic device, such as a notebook computer, that incorporates these components. It will be appreciated that, while the frame component 230 has been described in relation to a key on a computer keyboard, these frame components can be used in any application wherein there are protrusions which extend from printed circuit boards or other components that are mounted adjacent frame components necessitating cavities being formed in the frame components to accommodate the protrusions.

Although described above as conical-shaped depressions 232a, 232b, it should be understood that other tapered depressions can be formed to accommodate other protrusions or groups of protrusions on a printed circuit board. For example, the depressions can advantageously be V-shaped grooves formed in the frame component 230. The V-shaped grooves can advantageously have the same cross section as the conical depressions 232a, 232b illustrated in FIG. 3 and are formed by V-shaped protrusions or projections. V-shaped protrusions also permit the uniform flow of molten plastic in a manner to the flow around the conical-shaped protrusions, as described above.

Although the foregoing description of the preferred embodiment of the present invention has shown, described, and pointed out the fundamental novel features of the invention, it will be understood that various omissions, substitutions, and changes in the form of the detail of the apparatus as illustrated as well as the uses thereof, may be made by those skilled in the art without departing from the spirit of the present invention. Consequently, the scope of the invention should not be limited to the foregoing discussion, but should be defined by the appended claims.

What is claimed is:

1. A frame component for an electrical device having a first surface and a second surface and a first region of a first thickness, wherein one or more tapered depressions are formed on said first surface of said frame component in said first region so as to extend towards said second surface, and wherein said one or more tapered depressions are configured to receive protrusions from an electronic component mounted adjacent to said frame component and maintain said protrusions in electrical isolation from each other and from the second surface.

2. The frame component of claim 1, wherein said one or more tapered depressions define one or more portions of said frame component of a reduced thickness in said first region that are located between a bottom surface of said tapered depression and said second surface of said frame component, and wherein said second surface of said frame component is uniformly planar through said first region.

3. The frame component of claim 2, wherein said first thickness is approximately 1.5 mm and wherein said one or more portions of said frame component of a reduced thickness are approximately 0.3–0.4 mm thick.

4. The frame component of claim 2, wherein:
    said frame component is fabricated through plastic injection molding;
    said mold has one or more tapered protrusions formed therein that form said one or more tapered depressions in said frame component; and
    each of said protrusions defines a first sloped surface that facilitates flow of molten plastic during said plastic injection molding through an area of said mold corresponding to said portion of said frame component located between said bottom of said tapered depression and said second surface of said frame component.

5. The frame component of claim 1, wherein said frame component is configured to be used in a notebook computer and wherein said frame component is positioned adjacent to a printed circuit board for a keyboard.

6. The frame component of claim 5, wherein said frame component is also configured to receive keyboard switch leads that extend outward from a side of said printed circuit board located adjacent said first surface of said frame member.

7. The frame component of claim 6, wherein said frame component is configured so that said second side of said frame component comprises a portion of an outside casing of said notebook computer and wherein said outside casing of said notebook computer is substantially planar.

8. A frame component for an electronic device, comprising:
    a region of a frame material, said region having a first surface and a second surface, wherein said region of said frame material is of a substantially uniform first thickness; and
    a tapered depression formed in said first surface of said region of said frame material so that said tapered depression extends towards said second surface of said region with an apex of said tapered depression and said second surface of said region defining a minimum thickness of said frame component, said tapered depression configured to receive a protrusion which protrudes from a component of said electronic device mounted adjacent to said frame component.

9. The component of claim 8, wherein said frame material is plastic.

10. The component of claim 9, wherein said first thickness is approximately 1.5 mm and wherein said minimum thickness is between approximately 0.3–0.4 mm.

11. The component of claim 8, wherein:
    said frame component is fabricated by plastic injection molding;
    said mold has a tapered protrusion that forms said tapered depression in said frame component; and
    said tapered protrusion defines a first sloped surface that facilitates flow of molten plastic during said plastic injection molding through a region of said mold corresponding to the region of said frame component having said minimum thickness.

12. The component of claim 8, wherein said frame component is configured to be used in a notebook computer positioned adjacent a printed circuit board for a keyboard.

13. A method of forming a frame component that has one or more depressions capable of accommodating protrusions of an electronic component that extend towards a first surface of said frame component when said electronic component is mounted adjacent said frame component, said method comprising the steps of:
    providing a mold which defines a cavity wherein said cavity defines a shape of said frame component and wherein said cavity includes a protrusion which defines an inclined slope that terminates at substantially an apex of said protrusion; and
    injecting plastic into said mold wherein said inclined slope facilitates flow of said molten plastic through a region of said cavity between an apex of said protrusion and an inner surface of said cavity.

14. The method of claim 13, wherein said providing step comprises providing a mold wherein said protrusion is generally conical in shape so that a conical depression is formed in said frame component in response to said injecting step that is configured to receive a protrusion from an electronic component mounted adjacent said frame component.

15. The method of claim 14, wherein said providing step comprises providing a mold which defines a cavity that has inner dimensions so that, subsequent to said injecting step, a frame component having a thickness substantially equal to 1.5 mm from a first surface to a second surface is produced.

16. The method of claim 15, wherein said providing step further comprises providing a mold which defines a cavity that has inner dimensions so that, subsequent to said injecting step, a frame component which has a thickness between said apex of said depression and said second surface of between 0.3–0.4 mm is produced.

* * * * *